(12) United States Patent
Forrest et al.

(10) Patent No.: US 8,933,436 B2
(45) Date of Patent: Jan. 13, 2015

(54) ORDERED ORGANIC-ORGANIC MULTILAYER GROWTH

(75) Inventors: Stephen R. Forrest, Ann Arbor, MI (US); Richard R. Lunt, Cambridge, MA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 368 days.

(21) Appl. No.: 13/084,233

(22) Filed: Apr. 11, 2011

(65) Prior Publication Data
US 2012/0091436 A1    Apr. 19, 2012

Related U.S. Application Data

(60) Provisional application No. 61/392,783, filed on Oct. 13, 2010.

(51) Int. Cl.
| | | |
|---|---|---|
| H01L 51/46 | (2006.01) | |
| H01L 51/50 | (2006.01) | |
| C30B 23/02 | (2006.01) | |
| C30B 29/54 | (2006.01) | |
| H01L 51/00 | (2006.01) | |
| H01L 51/42 | (2006.01) | |
| H01L 51/56 | (2006.01) | |

(52) U.S. Cl.
CPC ............ *H01L 51/5012* (2013.01); *C30B 23/02* (2013.01); *C30B 29/54* (2013.01); *H01L 51/0008* (2013.01); *H01L 51/4246* (2013.01); *H01L 51/5004* (2013.01); *H01L 51/0053* (2013.01); *H01L 51/56* (2013.01); *H01L 2227/326* (2013.01); *Y02E 10/549* (2013.01)
USPC ........................................... 257/40

(58) Field of Classification Search
CPC .. H01L 51/5012; H01L 29/04; H01L 51/0058
USPC ............................................ 257/40
See application file for complete search history.

(56) References Cited

U.S. PATENT DOCUMENTS

| | | | |
|---|---|---|---|
| 6,806,491 B2 * | 10/2004 | Qiu et al. ................. | 257/40 |
| 7,288,331 B2 | 10/2007 | Thompson et al. | |
| 7,776,456 B2 | 8/2010 | D'Andrade et al. | |
| 2005/0072971 A1 * | 4/2005 | Marrocco et al. ........... | 257/40 |

(Continued)

FOREIGN PATENT DOCUMENTS

WO    2011025567 A2    3/2011

OTHER PUBLICATIONS

Kabe, R. et al., "Effect of Molecular Morphology on Amplified Spontaneous Emission of Bis-Styrylbenzene Derivatives", Adv. Mater. 2009, 21, pp. 4034-4038.

(Continued)

*Primary Examiner* — Wael Fahmy
*Assistant Examiner* — Sarah Salerno
(74) *Attorney, Agent, or Firm* — Duane Morris LLP

(57) ABSTRACT

An ordered multilayer crystalline organic thin film structure is formed by depositing at least two layers of thin film crystalline organic materials successively wherein the at least two thin film layers are selected to have their surface energies within ±50% of each other, and preferably within ±15% of each other, whereby every thin film layer within the multilayer crystalline organic thin film structure exhibit a quasi-epitaxial relationship with the adjacent crystalline organic thin film.

17 Claims, 16 Drawing Sheets

(56) References Cited

U.S. PATENT DOCUMENTS

| | | |
|---|---|---|
| 2007/0090371 A1 | 4/2007 | Drechsel et al. |
| 2007/0243658 A1 | 10/2007 | Hirai et al. |
| 2009/0165859 A1 | 7/2009 | Forrest et al. |
| 2010/0025663 A1* | 2/2010 | Sun et al. ............ 257/40 |

OTHER PUBLICATIONS

"Organic light-emitting diode", http://en.wikipedia.org/wiki/Organic_light-emitting_diode, pp. 1-16.

Ren, X., et al, "Ultrahigh Energy Gap Hosts in Deep Blue Organic Electrophosphorescent Devices", Chem. Mater. 2004, 16, pp. 4743-4747.

Koller, G., et al., "Heteroepitaxy of Organic-Organic Nanostructures", Nano Letters 2006, vol. 6, No. 6, pp. 1207-1212.

Forrest, S. R., et al., "Ultrahigh-vacuum quasiepitaxial growth of model van der Waals thin films. II. Experiment", Physical Review B, vol. 49, No. 16, pp. 11 309-11 321, Figures 1-9.

Kobayashi, H., et al., "The Crystal Structure of the Charge-transfer Complex of Dibenzotetra-thiafulvalene-Tetracyanoquinodimethane, DBTTF-TCNQ", Bull. Chem. Soc. Jpn., 54, (1981), vol. 54, No. 8, pp. 2408-2411.

Burrows, P.E., et al., "Observation and modeling of quasiepitaxial growth of a crystalline organic thin film", Appl. Phys. Lett. 61 (20), Nov. 16, 1992, p. 2417-2419.

Campione, M., et al., "Kinetic Phase Selection of Rubrene Heteroeptaxial Domains", J. Phy. Chem. C 2009, 113, pp. 20927-20933.

Akimichi, H., et al., "Structure of pentacene/tetracene superlattices depositing on glass substrate", Appl. Phys. Lett. 63(23), Dec. 6, 1993, pp. 3158-3160.

Kasemann, D., et al., "Line-on-Line Organic-Organic Heteroepitaxy of Quaterrylene on Hexa-peri-hexabenzocoronene on Au(111)", Langmuir 2009, 25(21), 12569-12573.

Schmitz-Hubsch, T., et al., "Direct observation of organi-organic heteroepitaxy: perylene-tetracarboxylic-dianhydride on hexa-peri-benzocoronene on highly ordered pyrolytic graphite", Surface Science 445(2000), pp. 358-367.

Huang, L., et al., "Heteroepitaxy growth high performance films of perylene dimide derivatives", Organic Electronics 11(2010)pp. 195-201.

So, F.F., et al., "Evidence for Exciton Confinement in Crystalline Organic Multiple Quantum Wells,", Physical Review Letters, vol. 66, No. 20, pp. 2649-2652.

Haskal, E.I., et al., "Excitons and exciton confinement in crystalline organic thin films frown by organic molecular-beam deposition", Physical Review B., vol. 51, No. 7, pp. 4449-4462.

Baldo, M., "Organic Vapor Phase Deposition", Advanced Materials.

Hasegawa, T., et al., "Organic field-effect transistors using single crystals", Sci. Technol. Adv. Mater. 10(2009) 024314, pp. 1-16.

Takahasi, Y., et al., "Tuning of electron injections for n-type organic transistor based on charge-transfer compounds", Applied Physics Letters 86, 063504 (2005), pp. 1-3.

Shibata, K., et al., "Contact resistance of dibenzotetrathiafulvalene-based organic transistors with metal and organic electrodes", Applied Physics Letters 92, 023305 (2008), pp. 1-3.

Lunt, R. R., et al., "Real-time monitoring or organic vapor-phase deposition of molecular thin films using high-pressure reflection high-energy electron diffraction", Applied Physics Letters 90, 181932 (2007) pp. 1-3.

Hillier, A.C., et al., "Epitaxial interactions between molecular overlayers and ordered substrates", Physical Review B., vol. 54, No. 190, pp. 14 037-14 051.

Winn, D., et al., "Modeling Crystal Shapes of Organic Materials Grown from Solution", AlChE Journal, Jul. 2000, vol. 46, No. 7, pp. 1348-1367.

Lunt, R. R., et al, "Growth of an Ordered Crystalline Organic Heterojunction", Adv. Mater. 2007, 19, pp. 4229-4233.

The International Search Report and Written Opinion for International Application No. PCT/US2011/055578, issued on Apr. 13, 2012.

* cited by examiner

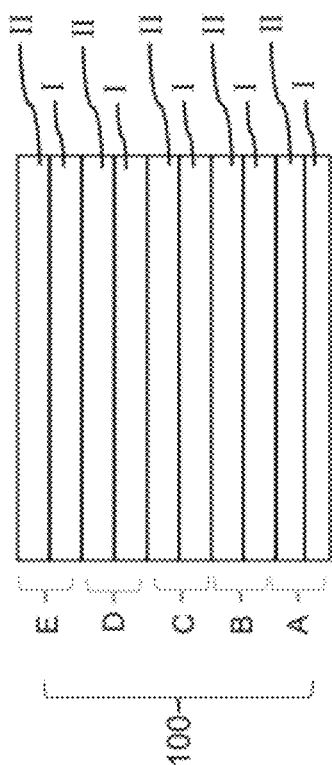

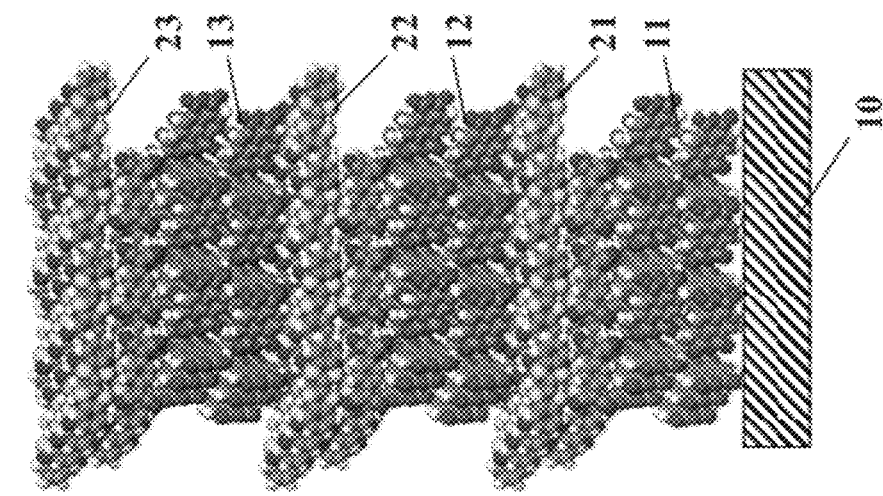
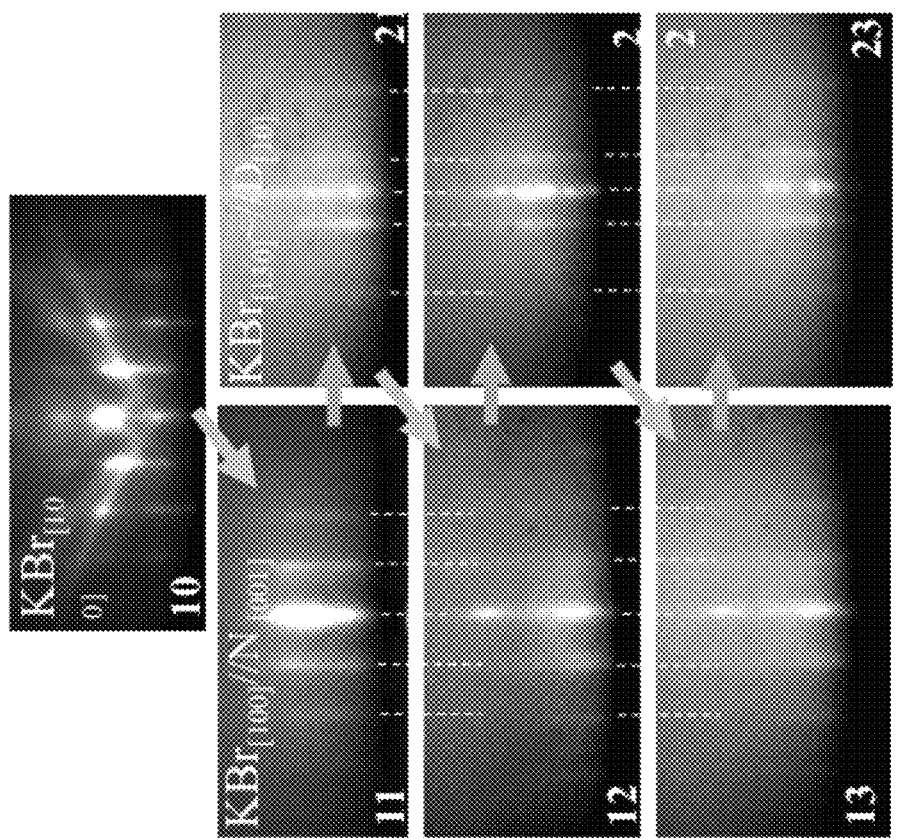
FIG. 1(c)
FIG. 1(d)

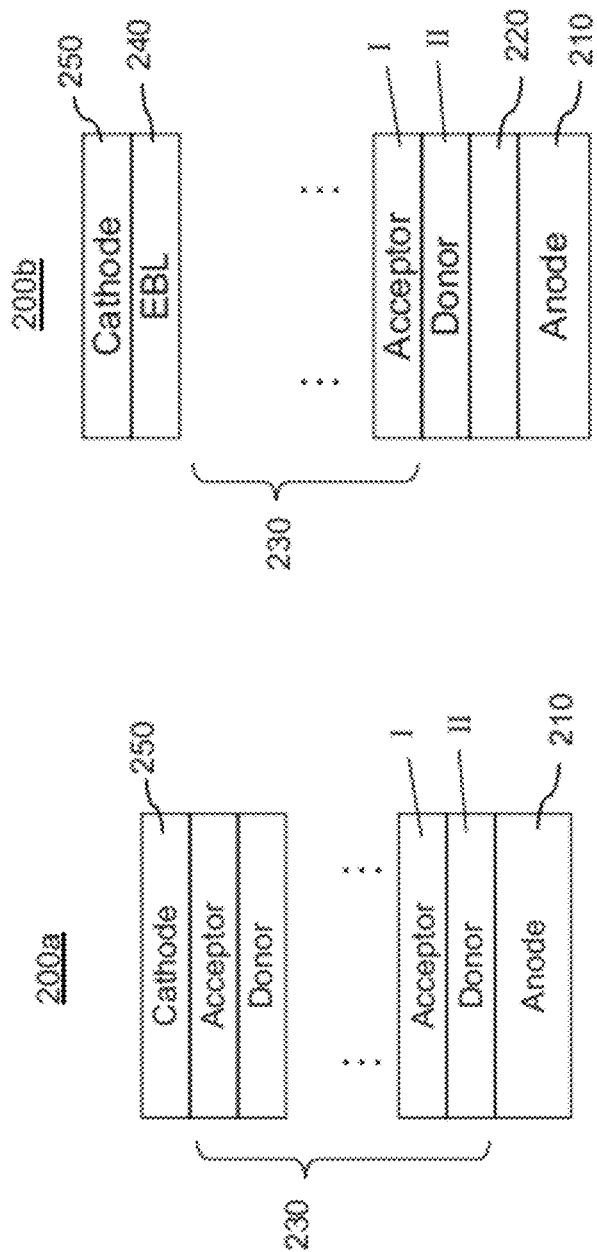

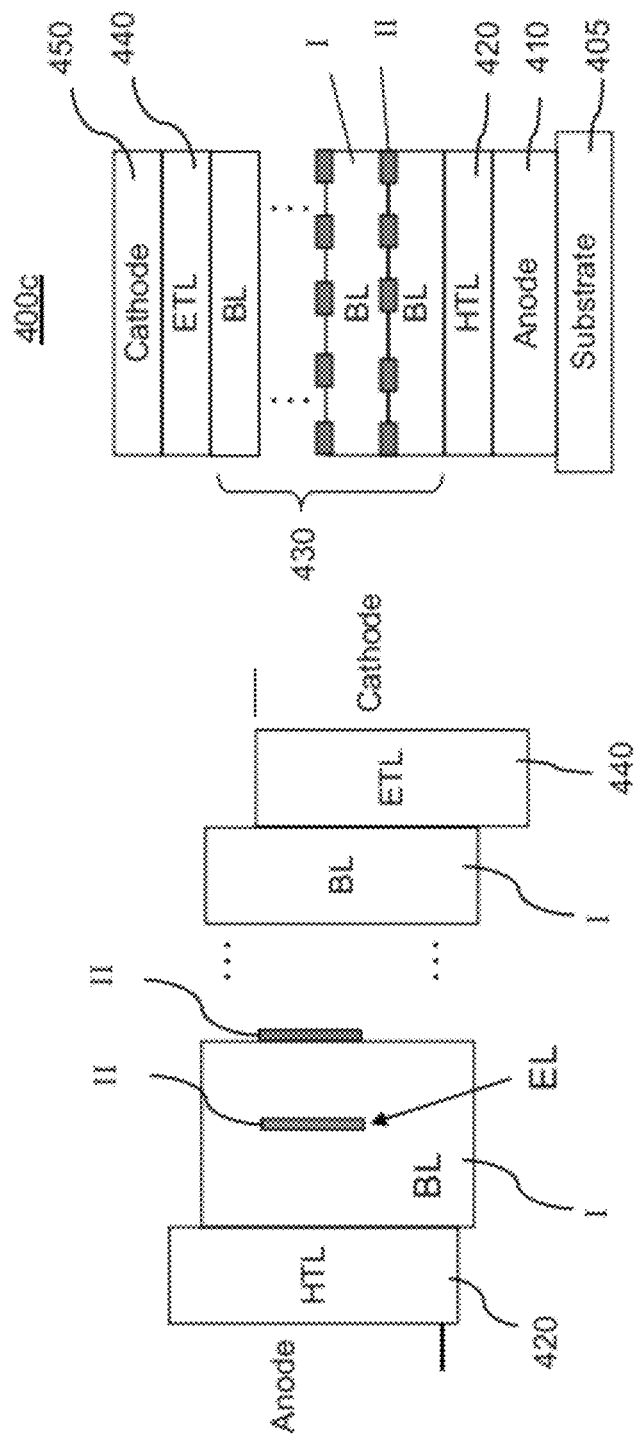

ORDERED ORGANIC-ORGANIC MULTILAYER GROWTH

CROSS-REFERENCE TO RELATED APPLICATIONS

This application claims the benefit under 35 U.S.C. §119(e) of U.S. Provisional Application Ser. No. 61/392,783, filed on Oct. 13, 2010, the disclosure of which is incorporated herein by reference in its entirety.

GOVERNMENT RIGHTS

This invention was made with U.S. Government support under grant number DE-FG36-08GO18022 awarded by the U.S. Department of Energy. The government has certain rights in the invention.

JOINT RESEARCH AGREEMENT

The claimed invention was made by, on behalf of, and/or in connection with one or more of the following parties to a joint university corporation research agreement: Regents of the University of Michigan, Princeton University, University of Southern California, Global Photonic Energy Corporation, and Universal Display Corporation. The agreement(s) was in effect on and before the date the claimed invention was made, and the claimed invention was made as a result of activities undertaken within the scope of the agreement(s).

TECHNICAL FIELD

The present disclosure relates to organic films for use in organic electronic devices.

BACKGROUND

In organic electronic devices made with organic thin films, the morphology (e.g., the crystal structure) of the organic films can play a role in determining the electronic and/or optical properties of the device. In many cases, the organic molecules in the films exhibit a pronounced anisotropy, and the orientation of the organic molecules within the film can influence charge carrier mobility. For example, creating crystalline order within an organic film of an organic light emitting device can reduce series resistance, and thereby increase luminous efficiency. In organic photosensitive devices such as organic photovoltaic (OPV) devices, creating crystalline order within an organic film of the photosensitive devices can increase the short-circuit current $J_{sc}$ and the open-circuit voltage $V_{oc}$. For example, controlling the molecular crystalline orientation of the donor layer for example can lead to beneficial changes in the frontier energy levels, absorption coefficient, morphology, and exciton diffusion length, resulting in an increase in the PV cell's power conversion efficiency, $\eta_p$. Furthermore, because crystalline structures are morphologically more stable than amorphous structures, the resulting devices would have the potential for greater long term operational reliability. While it is clear that the crystal structure of the organic molecules in an organic thin film can be an important feature of the devices, it has been difficult to achieve the desired film crystal structure. In particular, creating a multilayer crystalline organic film structure in which a quasi-epitaxial relationship is maintained through the multiple layers of crystalline organic thin film layers, similar to the inorganic semiconductor quantum wells, has not been achieved previously. Thus, there is a need for improved methods for growing multiple layers of crystalline organic films having a desired crystal structure for use in optoelectronic devices.

SUMMARY

According to an aspect of the present disclosure, a method for making an ordered multilayer crystalline organic thin film structure is disclosed. The method comprises depositing at least two layers of thin film crystalline organic materials (such as NTCDA and DB-TCNQ pair) successively, forming the multilayer crystalline organic thin film structure. The at least two thin film layers of crystalline organic materials have their surface energies within ±50% of each other whereby all of the at least two layers of thin film crystalline organic materials within the multilayer crystalline organic thin film structure exhibit a quasi-epitaxial relationship with the adjacent crystalline organic thin film layer. The method may further include providing a base substrate and depositing the at least two layer of thin film crystalline organic materials on the base substrate. The method can further include transferring the ordered multilayer crystalline organic thin film structure from the base substrate onto another substrate that is a precursor layer for an organic electronic device, wherein the multilayer crystalline organic thin film structure forms an active region of the electronic device.

According to an embodiment of the present disclosure, an organic photosensitive device comprising a first electrode, a second electrode, and a photoactive region disposed between the first electrode and the second electrode is disclosed. The photoactive region of the device comprises at least two thin film layers comprising at least two crystalline organic materials (such as NTCDA and DB-TCNQ) forming a multilayer crystalline organic thin film structure. One of the at least two crystalline organic materials is a hole conducting material and the other of the at least two crystalline organic materials is an electron conducting material and thereby forming a rectifying junction between the hole conducting material and the electron conducting material within the multilayer crystalline organic thin film structure. The surface energies of the at least two thin film layers are within ±50% of each other, whereby all of the crystalline organic thin film layers within the multilayer crystalline organic thin film structure exhibit a quasi-epitaxial relationship.

According to another embodiment, an organic light-emitting device (OLED) comprising a first electrode, a second electrode, and an organic light emitting region disposed between the first electrode and the second electrode is disclosed. The organic light-emitting region comprises at least two thin film layers comprising at least two crystalline organic materials (such as NTCDA and DB-TCNQ pair) forming a multilayer structure. One of the at least two crystalline organic materials is a non-emissive (transport/barrier) material and the other of the at least two crystalline organic materials is an emissive material wherein the surface energies of the at least two thin film layers are within ±50% of each other, whereby all of the crystalline organic thin film layers within the multilayer structure exhibit a quasi-epitaxial relationship. The transport/barrier layer can transport both holes and electrons and can also provide energy barrier to confine excitons in the light emitting region of the device.

In the method and device implementations mentioned above, the at least two crystalline organic materials can be polycrystal or single crystal materials. In a preferred embodiment, the at least two crystalline organic materials are single crystal organic materials. Additionally, the surface energies of the at least two thin film layers are preferably matched to be within ±30% of each other, further preferably to be within ±15%, within ±10% and more preferably within ±5% of each other.

According to another aspect of the invention, the method and the devices disclosed herein can comprise more than two thin film layers of at least two crystalline organic materials wherein the surface energies of the at least two thin film layers are within ±50% of each other whereby all of the more than two thin film layers of the crystalline organic materials exhibit quasi-epitaxial relationship with the adjacent crystalline organic thin film layer. Preferably, the surface energies of the at least two thin film layers are matched to be within ±30% of each other and further preferably to be within ±15% and more preferably to be within ±10% or ±5% of each other.

The term "quasi-epitaxy," is used herein to refer to thin film growth where there is not a strict lattice matching as in epitaxy but still having a strongly preferred alignment between the deposited layer and the underlying layer. As used herein, the term "rectifying" denotes, inter alia, that an interface has an asymmetric conduction characteristic, i.e., the interface supports electronic charge transport preferably in one direction.

BRIEF DESCRIPTION OF THE DRAWINGS

FIG. 1(a) shows a schematic cross-sectional view of an ordered multilayer organic thin film structure according to an embodiment.

FIG. 1(c) shows a schematic crystal structural model of the multilayer crystalline organic thin film structure according to an embodiment.

FIG. 1(d) shows high pressure reflection high energy electron diffraction (HP-RHEED) patterns of NTCDA/DB-TCNQ films grown on single-crystal KBr substrate by OVPD.

FIGS. 4(a) and 4(b) are drawn to scale.

FIGS. 6(a) and 6(b) illustrate examples of photosensitive devices incorporating the ordered multilayer crystalline organic thin film structure of the present disclosure.

FIG. 7(e) illustrates another example of an OLED device according to an embodiment.

FIG. 7(f) shows a schematic energy level diagram for the device of FIG. 7(e).

Figure 1B:
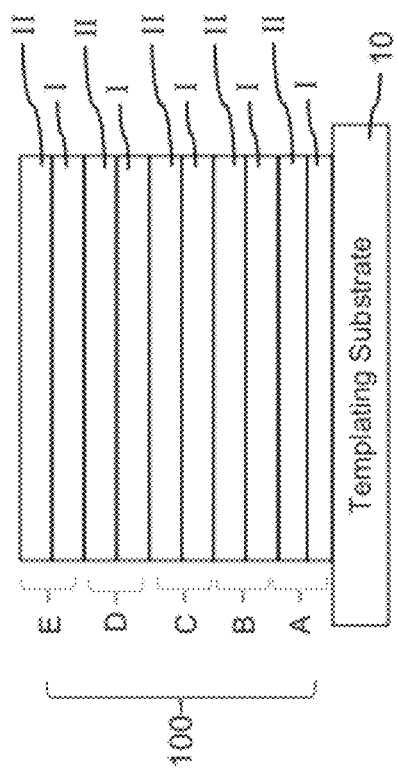
FIG. 1(b) shows a schematic cross-sectional view of an ordered multilayer organic thin film structure formed on a base substrate according another embodiment.

Except where noted, all drawings are schematic and are not drawn to scale and are not intended to necessarily convey actual dimensions.

DETAILED DESCRIPTION

Crystalline order and orientation influence both the electronic and optical properties of thin organic crystalline films. The growth of ordered crystalline organic layers has been of long standing interest as a means for improving organic optoelectronic device performance. The inventors have been able to demonstrate that multilayered structure having quasi-epitaxial crystalline order can be achieved by depositing thin film layers of two or more crystalline organic semiconductor materials via organic vapor phase deposition (OVPD) where the crystalline organic materials having closely matching surface energies are utilized. The thin film layers of the crystalline organic materials can be polycrystal but in a preferred embodiment, they are single crystal thin film layers. In one example, the inventors have successfully deposited alternating multiple quasi-epitaxial layers of single crystalline organic thin films by selecting two organic semiconductors that have closely matching surface energies.

The prior knowledge in the art did not predict the successful results achieved by the inventors because, although crystalline inorganic epitaxial heterostructures and quantum wells are ubiquitous features of state-of-the art optoelectronic devices, matching the surface energies of the adjacent layers is not a recognized criterion for heteroepitaxially depositing multiple layers of inorganic semiconductors. Thus, the method of the present disclosure enables depositing multiple layers of crystalline organic layers while maintaining quasi-epitaxial crystalline order by using crystalline organic materials that have closely matching surface energies for the multiple layers.

While there are number of examples of organic epitaxy on inorganic substrates, much less is known about crystalline ordering of organic-organic epitaxy. In part, this is because of the difficulties associated with growing highly ordered organic-organic heterojunctions. Observations of sustained ordered multilayer heteroepitaxial growth have been infrequent, possibly due to deposition-order anisotropies.

FIG. 1(a) shows a schematic cross-sectional view of an ordered multilayer crystalline organic thin film structure 100A formed by depositing at least two layers of thin film crystalline organic materials I and II successively, wherein the thin film crystalline organic materials I and II have closely matching surface energies. The first crystalline organic material I and the second crystalline organic material II are selected to have closely matching surface energies resulting in the two organic materials I, II forming a multilayer crystalline organic thin film structure exhibiting a quasi-epitaxial relationship. For optimal quasi-epitaxial relationship among the layers in the multilayer crystalline organic thin film structure, the surface energies of the thin film layers I, II are within ±50%, preferably within ±30%, more preferably within ±15%, and further more preferably within ±5% of each other.

The ordered multilayer crystalline organic thin film structure can be formed on a base substrate. FIG. 1(b) shows a schematic cross-sectional view of such an ordered multilayer crystalline organic thin film structure 100B formed by depositing at least two thin film layers of two crystalline organic materials I and II successively over a base substrate 10. The base substrate 10 can be an inorganic or organic material that weakly interact with the organic thin film layers grown thereon. "Weakly interacting" means that a thin film layer grown on the base substrate will form the lowest energy crystalline, i.e. only form van der Waals bonding, rather than covalent bonding, with the underlying substrate material. The base substrate material is crystalline and preferably a single crystal material. Examples of the materials for the base substrates are crystalline KBr, KCl, KI, crystalline oxides, such as corundum ($\alpha$-$Al_2O_3$) and sapphire and crystalline organic materials such as those listed in Table 1 below.

According to another embodiment the base substrate can be a material that would structurally template the crystalline organic thin film deposited thereon. "Structural templating" refers to the effect where the molecules of the base substrate material exhibit a particular ordered molecular arrangement and causes the crystalline organic thing film subsequently deposited thereon to follow the underlying ordered molecular arrangement of the base substrate material.

As stated earlier, the first crystalline organic material I and the second crystalline organic material II are selected to have closely matching surface energies resulting in the two organic materials I, II forming a multilayer crystalline organic thin film structure exhibiting a quasi-epitaxial relationship.

In this illustrated example, the at least two thin film layers are formed by five pairs A, B, C, D and E of the two crystalline organic materials I and II that are deposited over the base substrate 10. By selecting appropriate crystalline organic materials for forming this quasi-epitaxial multilayer structure, a multilayer crystalline organic thin film structure having beneficial electrical properties for improving organic devices can be formed. In a preferred embodiment, the thin film layers of the crystalline organic materials I and II are deposited as single crystal layers.

In one embodiment, one of the two crystalline organic materials I and II is a hole conducting material and the other of the two crystalline organic materials is an electron conducting material, thereby forming rectifying junctions between the hole conducting material and the electron conducting material within the multilayer crystalline organic thin film structure. Where the hole conducting material is an electron donor material and the electron conducting material is an electron acceptor material, the two materials form a donor-acceptor heterojunction and the resulting device is a photosensitive device. For example, in one embodiment, the first crystalline organic material I is NTCDA and the second crystalline organic material II is DB-TCNQ and they have closely matching surface energies. A multilayer crystalline organic thin film structure comprising at least two crystalline thin films of NTCDA and DB-TCNQ can be grown over a single crystal KBr base substrate with the first NTCDA layer being directly grown on the KBr base substrate 10. This method is believed to be expandable to using two or more, or at least two, crystalline organic materials for forming the multilayer crystalline organic thin film structure wherein the thin film layers have quasi-epitaxial ordering.

FIG. 1(c) shows a schematic crystal structural model of the multilayer crystalline organic thin film structure 100 formed by at least two layers of single crystal NTCDA and DB-TCNQ thin films grown over a KBr base substrate 10 with the first NTCDA layer 11 being directly grown on the KBr base substrate 10. Additional layers 11, 21, 12, 22, 13, and 23 of NTCDA and DB-TCNQ are shown. FIG. 1(d) shows the HP-RHEED patterns for the KBr substrate 10 and each of the crystalline organic layers 11, 21, 12, 22, 13, and 23. Each of the NTCDA and DB-TCNQ layers were 5 nm thick. In the figures, "N" denotes NTCDA and "D" denotes DB-TCNQ. The first NTCDA layer 11 grows on the KBr base substrate 10 with its (100) plane perpendicular to the KBr substrate. For NTCDA(100), the molecules are positioned in lengthwise contact with the KBr substrate, in an in-plane herringbone structure.

Congruent growth of DB-TCNQ layers 21, 22, 23 are grown at $T_{sub}$=0° C. and $r_{dep}$=0.4 nm/s on proceeding layers of NTCDA layers 11, 12, 13 grown at $T_{sub}$=25° C. and $r_{dep}$=0.15 nm/s. Positions of the diffraction streaks are highlighted by the white dashed lines. Note that the central streak for the DB-TCNQ layers 21, 22, 23 separates into multiple streaks indicating surface roughening with increasing number of layers. The electron beam energy and current were 20.0 keV and <0.1 µA respectively.

According to an embodiment, the inventors have been able to attain quasi-epitaxialy ordered multiple layers of single crystal 1,4,5,8-naphthalene-tetracarboxylic-dianhydride (NTCDA), and single crystal dibenzotetrathiafulvalene-tetracyanoquinodimethane (DB-TCNQ), grown on crystalline substrates via OVPD. The multiple quasi-epitaxial layers were built on a single crystal KBr substrate. Sustained ordering of the single crystal NTCDA and DB-TCNQ layers was maintained for more than 10 layers, with a clear quasi-epitaxial relationship between the adjacent single crystal layers in the multilayer crystalline organic thin film structure. The inventors believe that this symmetric growth-order phenomenon is largely attributable to crystal-surface energy matching between NTCDA and DB-TCNQ.

NTCDA is a wide-optical bandgap (3.1 eV) small molecular weight semiconductor, and DB-TCNQ is a semiconducting charge transfer complex with a comparatively small optical bandgap (~0.6 eV measured by optical spectroscopy). DB-TCNQ was prepared by mixing hot solutions of tetrahydrofuran with dissolved DB and TCNQ (with molar ratio DB to TCNQ of 1:1), upon which shiny black crystals precipitated. DB-TCNQ was used without further purification, while commercially obtained NTCDA was purified twice by gradient sublimation.

Each material was loaded into separate boats in a multi-barrel OVPD system equipped with in-situ high pressure reflection high energy electron diffraction (HP-RHEED). HP-RHEED is useful for monitoring both the crystal structure and quality of each layer before it is buried under the next layer.

All layers were grown with a nitrogen background pressure of 10 mTorr and source flow rate of 25 sccm (standard cubic centimeters per minute) on single crystal KBr substrates cleaved prior to growth. The substrate temperature was varied between ~40° C. and 90° C., and deposition rates were between 0.05 and 0.4 nm/s. Crystalline growth was monitored in real-time via in-situ HP-RHEED at a beam energy and current of 20 keV and <0.1 µA to avoid beam damage. In-plane lattice constants were measured from HP-RHEED patterns using the initial KBr diffraction pattern as a reference. Uncertainties for orientation matrices were propagated from the uncertainty of the measured lattice spacings and rotation angles. Ex-situ Bragg-Brentano X-ray diffraction measurements were preformed in a rotating anode diffractometer with a CuK$\alpha$ source to determine the out-of-plane molecular crystal spacing and orientation. Selected area electron diffraction (SAED) patterns were taken using a JEOL 3011 transmission electron microscope (TEM) operated at 300 keV with the organic layers mounted on a Cu grid after aqueous dissolution of the underlying KBr substrate. The growth of each layer was optimized around growth conditions leading to the most well-defined and longest RHEED streak patterns. Optimum growth conditions for NTCDA were substrate temperatures between 10° C. and 35° C., and growth rates between 0.05 nm/s and 0.15 nm/s, while the optimum growth conditions for DB-TCNQ were between −10° C. and 10° C., and 0.15 nm/s and 0.4 nm/s. Several minutes of pause between growth of each layer was required to change the substrate temperature.

Figure 2:
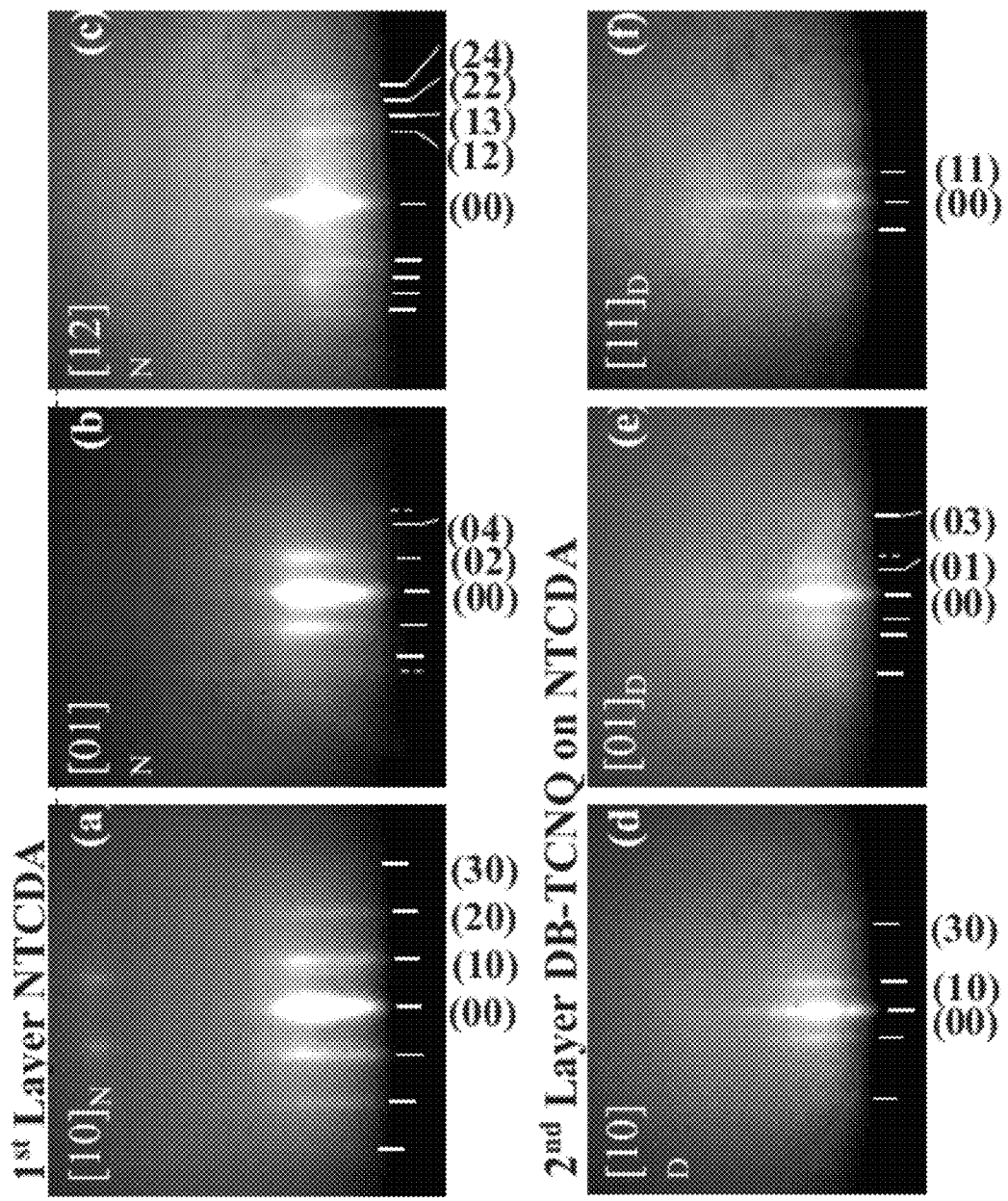
FIG. 2 shows HP-RHEED patterns for the first layer 11 of NTCDA and the second layer 22 of DB-TCNQ for the growth in FIG. 1.

In FIG. 2, the HP-RHEED patterns of the first layer of single crystal NTCDA (layer 11 in FIG. 1(b)) and the second layer of single crystal DB-TCNQ (layer 22 in FIG. 1(b)) are shown for various rotations. FIG. 2(a),(b),(c) are the HP-RHEED patterns for the first layer NTCDA and the FIG. 2(d),(e),(f) are the HP-RHEED patterns for the second layer DB-TCNQ. The measured d-spacings for NTCDA are (a) (10),(20),(30)=0.491 nm, 0.332 nm, 0.250 nm, respectively, (b) (02), (04)=0.652 nm, 0.331 nm, respectively, and (c) (12), (13), (22), (24)=0.492 nm, 0.393 nm, 0.240 nm, 0.203 nm, respectively. The measured d-spacings for TCNQ are (d) (10), (30)=0.849 nm, 0.272nm, respectively, (e) (01), (03)=0.984 nm, 0.323 nm, respectively, and (f) (11)=0.805 nm. Note that diffraction stemming from the first-order Laue zone in (a) can be observed for NTCDA. The NTCDA alignments are $[10]_N//[100]_{KBr}$, $[01]_N//[010]_{KBr}$, and $[12]_N\sim//[110]_{KBr}$ and the DB-TCNQ alignments are $[10]_D\sim//[130]_{KBr}$, $[01]_D//[010]_{KBr}$, $[11]_D\sim//[320]_{KBr}$.

The diffraction patterns vary along different azimuthal angles corresponding to different crystal directions in the NTCDA lattice, indicating single-crystalline ordered growth across the substrate (~2×2 cm$^2$). Additionally, the diffraction patterns exhibit long unbroken streaks that are indicative of a flat surface, from which we infer a layer-by-layer growth mode. The bulk lattice of NTCDA(100) has unit mesh dimensions of $b_1$=1.257 nm, $b_2$=0.531 nm, and β=90°. From the HP-RHEED data, we measure $b_1$=1.31(±0.01) nm, and $b_2$=0.497(±0.005) nm for the first layer, which is slightly reconstructed from the bulk phase, but nearly identical to the observations made for NTCDA(100) grown on crystalline PTCDA on highly ordered pyrolytic graphite (HOPG).

Figure 3:
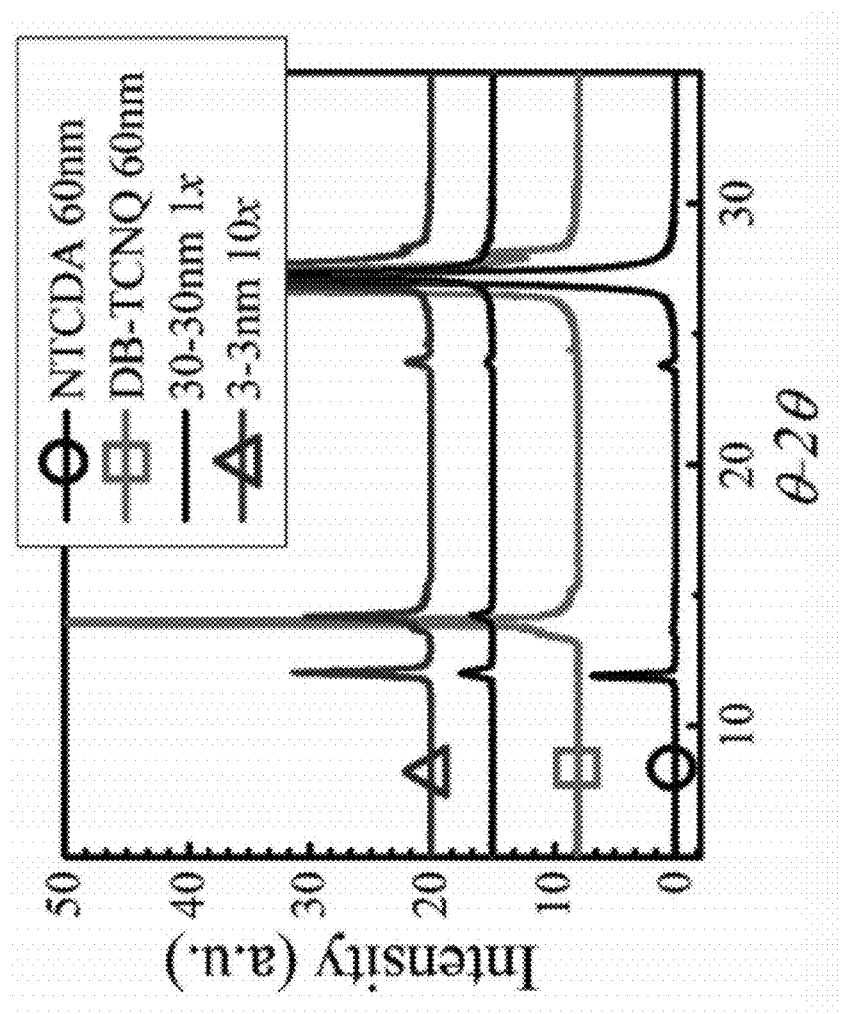
FIG. 3 shows X-ray diffraction patterns for single and multilayers of NTCDA and DB-TCNQ.

FIG. 3 shows X-ray diffraction (XRD) patterns for single and multilayers of NTCDA and DB-TCNQ. The diffraction peaks in the multilayer structure are a simple convolution of the (100) and (001) peaks seen in the single-layer diffraction for NTCDA and DB-TCNQ. The normal direction alignments of these two lattices are therefore $(100)_N//(001)_D$. Note that multiple diffraction orders (n00) and (00n) are observed for NTCDA and DB-TCNQ, respectively, and the KBr (002) peak is seen at 2θ=27.80°.

From the XRD data, we measure an out-of-plane d-spacing of $d_{(100)}$=0.745(±0.003) nm, which is slightly compressed compared to the bulk spacing of $d_{(100)}$=0.751(±0.001) nm, indicating tetragonal distortion. The in-plane NTCDA lattice constants were not found to vary for neat-film growth of thicknesses up to 100 nm, suggesting that although the lattice is reconstructed, this does not lead to large strain accumulation. The epitaxial relationship between the KBr and NTCDA lattices ($a_{KBr}$=M·$b_{NTCDA}$) is measured to be $$M = \begin{pmatrix} 1.985 \pm 0.014 & 0 \pm 0.009 \\ 0 \pm 0.012 & 0.753 \pm 0.008 \end{pmatrix}.$$

Hence, an approximately coincident (all approximately rational values of $M_{ij}$), or quasi-epitaxial structure, is observed within the error of the measured surface mesh.

Figure 4:
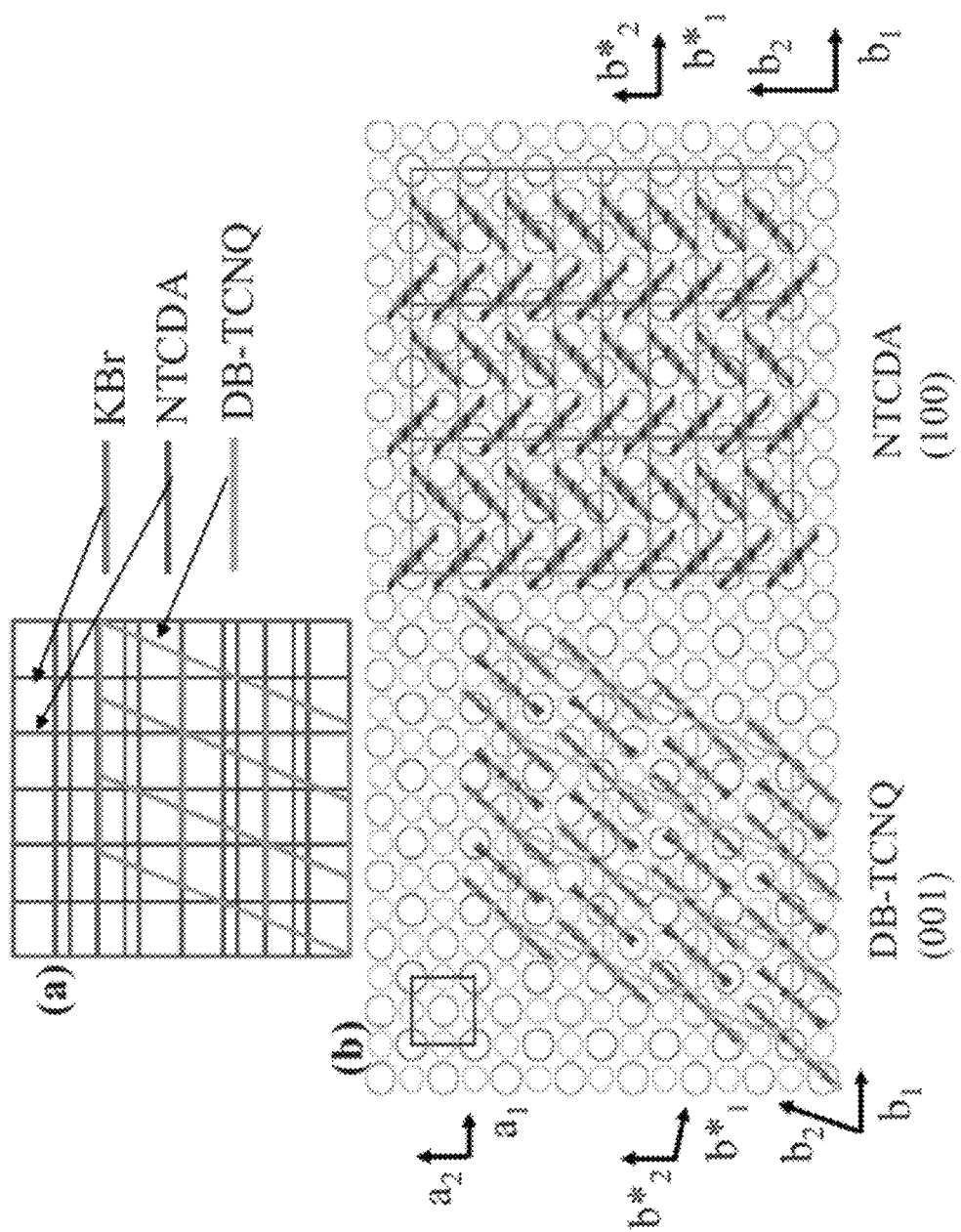
FIGS. 4(a) and 4(b) show a model of the real-space overlayer alignment for DB-TCNQ and NTCDA on KBr diagrammed with (b) and without (a) the molecules in the unit cell.

The film unit mesh orientation on KBr is shown schematically in FIG. 4. Note that for any given matrix alignment with a finite uncertainty, it is almost always possible to find a rational number that lies within this uncertainty. That is, over a large enough "supercell," any lattice will appear to be coincident. For this reason, we maintain the use of the term "quasi-epitaxy," rather than "coincident-epitaxy." FIG. 4(a) shows a model of the real-space overlayer alignment for DB-TCNQ and NTCDA on KBr diagrammed without the molecules in the unit cell. FIG. 4(b) shows the model with the molecules in the unit cell. FIGS. 4(a) and (b) are drawn to scale. In FIG. 4(a) the nearly coincident overlayer alignments between NTCDA and DB-TCNQ are apparent. In FIG. 4(b), the molecular alignment within the unit cell is assumed from the bulk phase crystal structure. The potassium ions are slightly smaller than the bromine ions, and the KBr unit cell is indicated. The reciprocal lattice vectors (b*) are also highlighted for NTCDA and DB-TCNQ.

For DB-TCNQ, the (001) orientation on KBr has the DB and TCNQ molecules lying lengthwise on the substrate in alternating parallel rows. Most remarkable is the fact that these data strongly suggest that the two component growth of DB and TCNQ is almost perfectly congruent, similar to what is observed in group III-V and II-VI binary semiconductor alloys. The resulting DB-TCNQ structure is also shown in FIG. 4. The bulk lattice surface mesh of DB-TCNQ (001) is $b_1$=0.922 nm, $b_2$=1.064 nm, β=67.66°. From the HP-RHEED data, we measure $b_1$=0.91(±0.01) nm, $b_2$=1.056(±0.01) nm, and β=67(±1.5)° (note that β=66.5(±0.5)° was confirmed from the TEM data) for a layer grown on KBr, which is within error of the bulk phase dimensions. From XRD, we measured an out-of-plane spacing of $d_{(001)}$=0.631(±0.002) nm, which is also within error of the bulk value of $d_{(100)}$=0.633(±0.001) nm. That is, while the NTCDA lattice is reconstructed, the DB-TCNQ lattice is not. The measured lattice meshes were identical (within error) to those measured for the first layer of DB-TCNQ grown on NTCDA. The relationship between the KBr and DB-TCNQ lattices can be described by the transformation matrix $$M = \begin{pmatrix} 1.379 \pm 0.015 & 0 \pm 0.017 \\ 0.625 \pm 0.025 & 1.473 \pm 0.016 \end{pmatrix}.$$

Figures 5A, 5B:
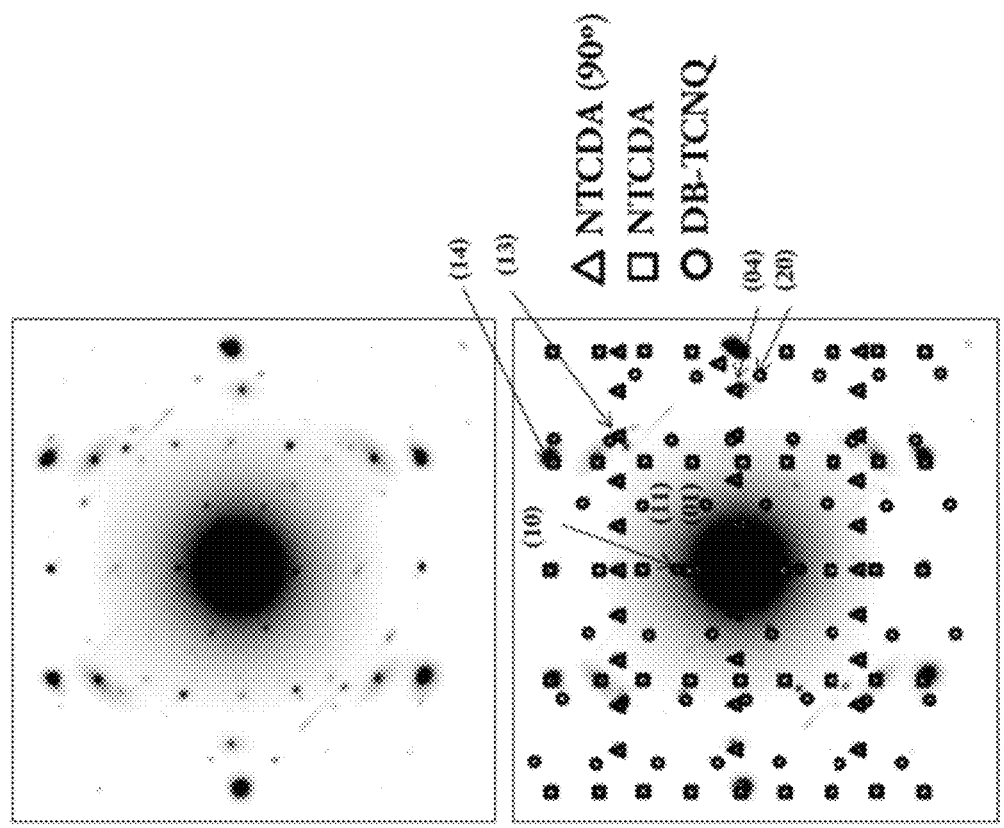
FIG. 5(a) shows transmission electron microscope (TEM) diffraction pattern from an NTCA/DB-TCNQ bilayer transferred from the KBr substrate via aqueous solution etching.
FIG. 5(b) shows TEM diffraction pattern from FIG. 5(a) overlaid with the measured reciprocal lattice map.

The lattice alignment determined from the HP-RHEED data is confirmed by TEM diffraction on a bilayer structure shown in FIGS. 5(a) and 5(b). FIG. 5(a) is a transmission electron microscope (TEM) diffraction pattern from an NTCDA/DB-TCNQ bilayer transferred from the KBr substrate via aqueous solution etching. The NTCDA/DB-TCNQ bilayer was transferred to a Cu grid in order to perform the TEM diffraction. The transfer was made by pressing the NTCDA/DB-TCNQ bilayer side of the bilayer/KBr structure onto the Cu grid allowing mechanical adhesion of the bilayer to the Cu grid. The KBr substrate was then dissolved in water. The electron beam is oriented normal to the bilayer surface and (001)KBr//(100)N//(001)D. In FIG. 5(b), the TEM pattern from FIG. 5(a) is overlaid with the measured reciprocal lattice map. This map is consistent with the picture obtained from HP-RHEED, except that two rotations of NTCDA are observed: one of much lower diffraction intensity and rotated by 90° than the other. The alignment of the [01]D/[01]N and (001)D//(100)N are also consistent with the XRD data in FIG. 3. Note that the diffraction spots yield the d-spacing of the surface mesh since the monoclinic/triclinic (hkl) reciprocal lattice points lie slightly out-of plane (also leading to a relatively low diffraction intensity). The TEM diffraction data were obtained at a beam energy of 300 keV.

Although only one orientation was observed for NTCDA in HP-RHEED, two orientations are found to be rotated by 90° in the TEM diffraction patterns, although one of the rotations exhibits a very low intensity. These orientations of the NTCDA layer around the KBr lattice are energetically equivalent, and one might expect to see equal distributions along both. However, the diffusive growth conditions in OVPD, along with step edge nucleation may explain the presence of a single preferred alignment. Nonetheless, the exact alignments can be deduced from these data which confirmed the values of $$M = \begin{pmatrix} 0.695 \pm 0.009 & 0 \pm 0.017 \\ 0.315 \pm 0.024 & 1.956 \pm 0.041 \end{pmatrix}$$

from HP-RHEED data.

Returning to FIGS. 1(b) and 1(c), we observed that in growing additional layers beyond the first two layers of NTCDA and DB-TCNQ on KBr, the orientation and order are maintained throughout the multilayer crystalline organic thin film structure. The azimuthal dependence shown in FIG. 2 is observed for at least 10 layers of (5 nm) NTCDA and (5 nm) DB-TCNQ. We found that the choice between NTCDA and DB-TCNQ for the initial layer over the KBr substrate does not affect the ability to continue with ordered crystalline growth through the multilayer crystalline organic thin film structure. However, when starting with NTCDA as the initial layer, the layer roughness was minimized (as observed by the HP-RHEED streak continuity), leading to maintaining the crystalline ordering for a larger number of pairs. While greater than 10 layers can be grown, the reduction in the HP-RHEED streak length into spot-like features (e.g. FIGS. 1(e), 1(g)) indicates the evolution of at least some surface roughening.

From the HP-RHEED data, we find that the NTCDA $b_1$ lattice parameter decreases monotonically from 0.497($\pm$0.005) nm in the first layer, to 0.482($\pm$0.005) nm in the second layer, and 0.473($\pm$0.005) nm in the third layer. In contrast, the DB-TCNQ lattice remains unchanged with $b_1$=0.910($\pm$0.010) nm in the first layer, 0.908($\pm$0.01) nm in the second layer, and 0.905($\pm$0.01) nm in the third layer. Interestingly, the NTCDA lattice becomes more distorted from the bulk phase with each subsequent layer. This behavior is distinct from the neat layer growth of NTCDA on KBr where the lattice constant remained constant. Therefore, the inventors found that the epitaxial structures are related to the energy landscape evolution, which may be different in the presence of the DB-TCNQ as compared to KBr.

Surface energies are indeed important in wetting phenomena. Table 1 below shows the results of calculations of the van der Waals surface energy for various crystalline orientations and materials. Both NTCDA and DB-TCNQ grown on KBr (001) by OVPD form the lowest energy crystalline surfaces of (100) and (001), respectively. This indicates that there are only weak interactions between each layer and the substrate, and between the two organic layers. Comparing the surface energies of the NTCDA(100) and DB-TCNQ(001), we find close agreement of 0.121 kcal/mol-$Å^2$ and 0.125 kcal/mol-$Å^2$, respectively, about 3% difference between the two.

TABLE 1

Calculated surface energies for a range of organic crystals including DB-TCNQ and NTCDA.

| Material | Crystal Plane | Surface Energy (kcal/mol-$Å^2$) |
| --- | --- | --- |
| NTCDA | (001) | 0.211 |
| NTCDA | (202) | 0.160 |
| NTCDA | (100) [a] | 0.121 |
| DB-TCNQ | (2$\bar{1}$0) | 0.212 |
| DB-TCNQ | (010) | 0.136 |
| DB-TCNQ | (001) [a] | 0.125 |
| Anthracene | (001) [a] | 0.149 |
| Tetracene | (001) [a] | 0.146 |
| Pentacene | (001) [a] | 0.149 |
| Rubrene | (200) [a] | 0.129 |
| Coronene | (10$\bar{1}$) [a] | 0.092 |
| NPD | (101) [a] | 0.178 |
| $C_{60}$ | (111) [a] | 0.146 |

[a] Lowest energy surfaces.

Surface energies of various other organic crystals beyond those listed in Table 1 can be found in various publications or determined using methods well known to one or ordinary skill in the art. While there may be other factors leading to the ordered multilayer crystalline growth, the inventors have shown that the surface energy matching is an important factor in inducing wetting, and hence inducing ordered growth across heterointerfaces necessary to obtain smooth and ordered crystalline films though multiple layers of the surface energy matched organic semiconductor materials.

Based on the surface energy values provided in Table 1, examples of other pairs of materials that have closely matching surface energies that can be used to build the donor acceptor ordered multilayer crystalline organic thin film structures of a photoactive region of an OPV device are tetracene/pentacene (0.146/0.149 kcal/mol-$Å^2$), pentacene/$C_{60}$ (0.149/0.146 kcal/mol-$Å^2$) and tetracene/$C_{60}$ (0.146/0.146 kcal/mol-$Å^2$). Examples of a transport/barrier material and an emissive material pairs of materials that have closely matching surface energies that can be used to build the light emitting region of an OLED are anthracene/tetracene (0.149/0.146 mol-$Å^2$), tetracene/rubrene (0.146/0.129 mol-$Å^2$), and anthracene/rubrene (0.149/0.129 mol-$Å^2$).

In the examples, the inventors used a single crystal KBr substrate as the base substrate for growing the multiple layers of single crystal organic thin film layers thereon to form the ordered multilayer crystalline organic thin film structure. As discussed above, however, other inorganic or organic crystalline materials that weakly interact with the organic thin film layers grown thereon can also be used as the base substrate. "Weakly interacting" means that a thin film layer grown on the base substrate will form the lowest energy crystalline, i.e. only form van der Waals bonding, rather than covalent bonding, with the underlying substrate material.

The ordered multilayer crystalline organic thin film structures described herein are essentially quantum wells. Therefore, the ordered multilayer crystalline organic thin film structures can be utilized as the active regions/layers in optoelectronic devices. The ordered multilayer crystalline organic thin film structures can form the photoactive region in photosensitive devices such as an OPV device or they can form the light emitting region in OLEDs.

Referring to FIG. 6(a), an example of an organic device 200a according to an embodiment can comprise a first electrode (such as ITO) 210, a second electrode 250, and a photoactive region 230 disposed between the two electrode electrodes. The photoactive region 230 comprises at least two thin film layers of at least two single crystal organic materials I, II (e.g. NTCDA(100) and DB-TCNQ(001), respectively) having closely matched surface energies forming a multilayer crystalline organic thin film structure. The crystalline organic material I is a hole conducting material and the other crystalline organic material II is an electron conducting material and the materials form rectifying junctions therebetween. The surface energies of the organic thin film layers I, II are within ±50% of each other, preferably within ±30%, more preferably within ±15%, and further preferably within ±10% or ±5% of each other, whereby any two adjacent crystalline organic thin film layers within the photoactive region 230 exhibit a quasi-epitaxial relationship. In an embodiment, the organic device 200a is a photosensitive device and the hole conducting material I is a donor material and the electron conducting material II is an acceptor material. In such photosensitive device, the crystalline organic material layers I and II form donor-acceptor heterojunctions within the multilayer crystalline organic thin film structure. In a preferred embodiment, the crystalline organic material layers I and II are single crystal layers for optimal electrical performance of the device.

Figure 6C:
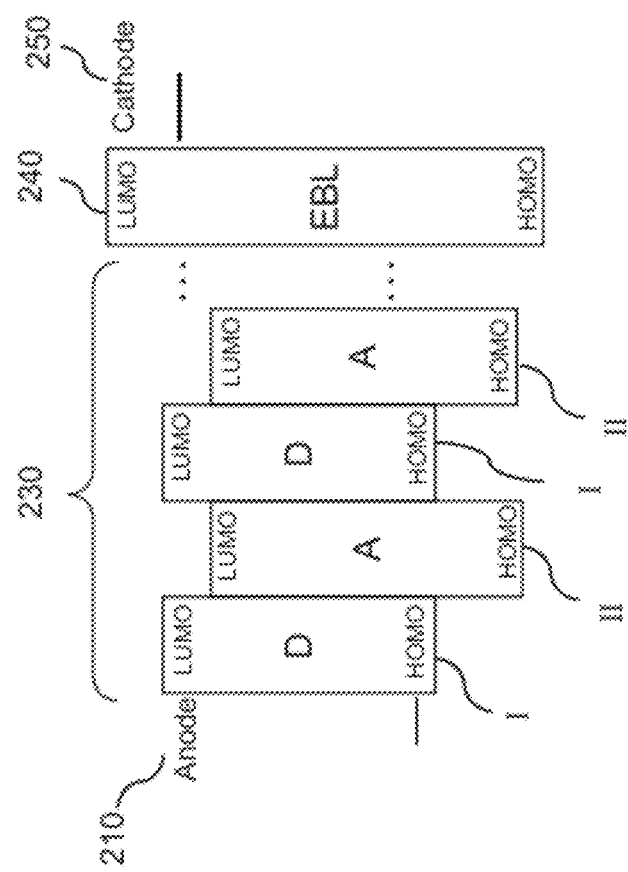
FIG. 6(c) shows a schematic energy level diagram for the device of FIG. 6(b).

FIG. 6(b) shows an organic photosensitive device 200b according to another embodiment where the device 200b is configured with an additional layer, an optional anode smoothing layer 220, provided between the electrode 210 and the photoactive region 230. Additionally, an exciton blocking layer 240 can be provided between the photoactive region 230 and the second electrode 250. FIG. 6(c) shows a schematic energy level diagram for the organic photosensitive device 200b of FIG. 6(b). The donor I and acceptor II materials in the multilayer crystalline organic thin film structure 230 form a series of type-II heterojunctions.

Figure 7A:
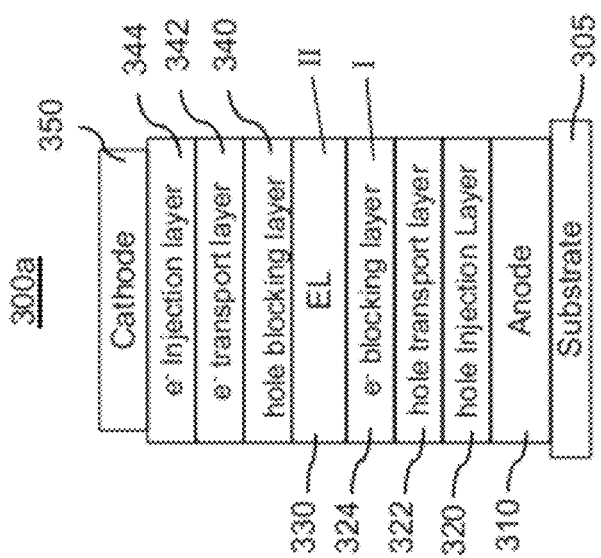
FIGS. 7(a), 7(b), 7(c) illustrate examples of OLED devices incorporating the ordered multilayer crystalline organic thin film structure of the present disclosure.

Referring to FIG. 7(a), an example of an organic light-emitting device (OLED) 300 is shown. The OLED 300 can comprise a suitable substrate 305, an anode 310, a hole injection layer 320, a hole transport layer (HTL) 322, an electron blocking layer 324, an emissive region 330, a hole blocking layer 340, an electron transport layer 342, an electron injection layer 344 and a cathode 350.

In this embodiment, the emissive region 330 is an amorphous material layer and the layers provided between the emissive region 330 and the anode 310 are crystalline layers having closely matching surface energies whereby the crystalline layers have quasi-epitaxial relationship among them. Similarly, the layers between the emissive region 330 and the cathode 350 are crystalline layers that have closely matching surface energies whereby the crystalline layers have quasi-epitaxial relationship among them. The crystalline layers can be polycrystal and in a preferred embodiment, the crystalline layers are single crystal layers for optimal electrical performance of the device.

The emissive region 330 in this embodiment is an amorphous layer that may include an organic material capable of emitting light when a current is passed between the anode 310 and the cathode 350. Preferably, the emissive region 330 contains a phosphorescent or fluorescent emissive dopant materials dispersed in a suitable host material. Phosphorescent materials are preferred because of their higher luminescent efficiencies.

Each group of the quasi-epitaxial crystalline layers between the amorphous emissive region 330 and the two electrodes are formed as a multilayer crystalline organic thin film structure on a base substrate as described above in connection with the formation of the quasi-epitaxial multilayer crystalline layers of FIG. 1(b). Thus, the crystalline layers between the emissive region 330 and the anode 310: the hole injection layer 320, the hole transport layer 322, and the electron blocking layer 324, are first formed as a quasi-epitaxial multilayer crystalline organic thin film structure over the base substrate and then transferred over on top of the anode 310 by the stamping process described above. Next, the amorphous emissive region 330 is deposited on top of the quasi-epitaxial multilayer crystalline organic thin film structure. Then, the next quasi-epitaxial multilayer crystalline organic thin film structure comprising the hole blocking layer 340, the electron transport layer 342 and the electron injection layer 344 is transferred over on top of the emissive region 330 by the stamping process.

Figure 7C:
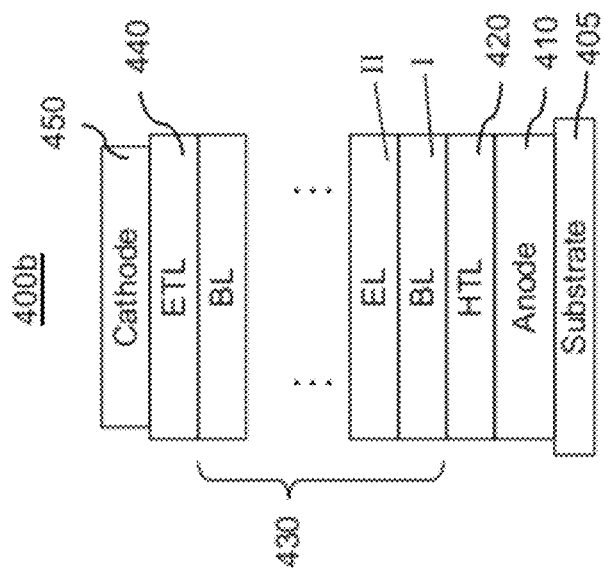
Figure 7B:
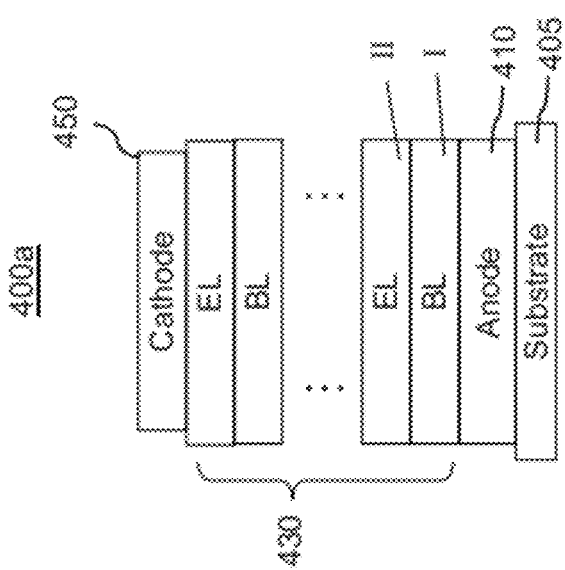

Referring to FIG. 7(b), an example of an organic light-emitting device (OLED) 400a according to an embodiment can comprise a first electrode 410, a second electrode 450, and a light emitting region 430 disposed between the two electrodes. The light emitting region 430 is a multilayer crystalline organic thin film structure comprising at least two thin film layers of at least two crystalline organic materials I, II in which the crystal organic materials I, II have closely matching surface energies. In this example, the first crystalline organic material I is a non-emissive transport/barrier layer (BL) and the second crystalline organic material II is an emissive layer (EL) material. The surface energies of the at least two thin film layers are at least within ±50%, preferably within ±30%, more preferably within ±15%, and further preferably within ±10% or within ±5% of each other, whereby all of the crystalline organic thin film layers within the light emitting region 430 exhibit a quasi-epitaxial relationship. The BL layer can transport both holes and electrons and can also provide energy barrier to confine excitons in the light emitting region 430. In one preferred embodiment, the crystalline organic materials I and II are single crystal organic materials.

Figure 7D:
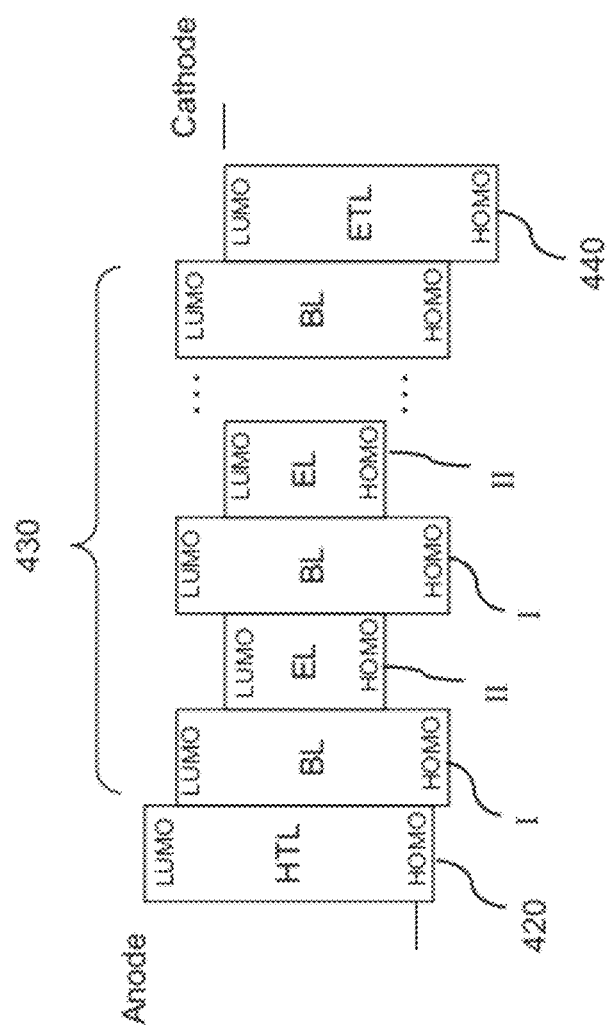
FIG. 7(d) shows a schematic energy level diagram for the device of FIG. 7(c).

FIG. 7(c) shows another embodiment of the OLED 400b that is configured with an optional additional HTL 420 provided between the first electrode 410 (anode) and the light emitting region 430 and an electron transport layer (ETL) 440, that is separate from the EL I, provided between the light emitting region 430 and the second electrode 450 (cathode). FIG. 7(d) shows a schematic energy level diagram for the OLED 400b of FIG. 7(c). As illustrated by the energy level diagram, the transport/barrier layers (BL) have wider band gap than the adjacent emissive layers and can confined excitons in the light emitting region 430.

Referring to an OLED 400c shown in FIG. 7(e), according to another embodiment, the second crystalline organic material II, the emissive layer (EL) material, can be deposited as discontinuous layers comprising a plurality of discontinuous islands between the non-emissive transport/barrier layers I. The OLED 400c comprises an anode 410 and a cathode 450 and a multilayer crystalline organic thin film structure 430 forming the light emitting region disposed between the two electrodes. The light emitting region 430 comprises at least two thin film layers of the at least two crystalline organic materials I, II having a closely matched surface energies forming an ordered multilayer crystalline organic thin film structure, wherein the first crystalline organic material I being the non-emissive transport/barrier layer and the second crystalline organic material II being the EL material. The EL material II is deposited as discontinuous layers formed of a plurality of islands on the adjacent preceding non-emissive transport/barrier layer I. Although the resulting multilayer crystalline organic thin film structure 430 (the light emitting region) does not have the conventional amorphous composition of an emissive region, the discontinuous layers of the EL material II sandwiched between the non-emissive material layers I provide a structure in which the EL material II is dispersed throughout the multilayer crystalline organic thin film structure 430 and the light emitting region 430 functions similar to an amorphous host/dopant structure. FIG. 7(f) shows a schematic energy level diagram for the OLED 400c of FIG. 7(e).

The EL material II can be deposited as discontinuous crystalline layers by appropriately controlling the process parameters to control the interplay of thermodynamics and kinetics of thin film growth during the deposition process. For example, Oura, K., V. G. Lifshits, A. A. Saranin, A. V. Zotov, and M. Katayama, SURFACE SCIENCES: AN INTRODUCTION, Berlin: Springer (2003), pp. 357-374 explains that formation of discontinuous islands during thin film growth is one of three generally accepted modes of thin film epitaxy. The three modes being: (a) island or Volmer-Weber, (b) layer-plus-island or Stranski-Krastanov, and (c) layer-by-layer or Frank-van der Merwe modes. These three modes are recognized and understood in the art as the primary thin film growth processes. In the layer-by-layer, or Frank-van der Merwe mode, each layer is fully completed before the next layer starts to grow. In the island, or Vollmer-Weber mode, the depositing atoms nucleate into three-dimensional islands and grow directly on the substrate surface.

In the OLED embodiments 400a, 400b and 400c of FIGS. 7(b), 7(c) and 7(e), respectively, the emissive layers II are crystalline thin films. Although, the emissive materials employed in OLEDs conventionally have been amorphous, recent studies have shown that photoluminescence quantum yield in crystalline, especially single crystals, materials can be greater than in amorphous/polycrystalline films and thus the emissive layers can be crystalline thin films. Examples of such crystalline materials for the crystalline emissive layers II in the disclosed embodiments are 1,4-bis(2-methylstyryl)benzene (o-MSB) and 1,4-bis(4-methylstyryl)benzene (p-MSB) disclosed in Ryota Kabe, Jajime Nakanotani, Tomo Sakanoue, Masayuki Yahiro and Chihaya Adachi, *Effect of Molecular Morphology on Amplified Spontaneous Emission of Bis-Styrylbenzene Derivatives*, Adv. Mater., 21, 4034-4038 (2009).

In order to fabricate the organic optoelectronic devices 200a, 200b, 300, 400a, 400b, 400c comprising the multilayer crystalline organic thin film structures 230, 330, 430, the multilayer crystalline organic thin film structures 230, 330, 430 would need to be grown on a base substrate, such as KBr, similar to the example of FIG. 1(a), and then transferred onto an appropriate structural host substrate that is a precursor to forming the particular optoelectronic device 200a, 200b, 300, 400a, 400b, 400c and complete the fabrication of the optoelectronic device. As mentioned earlier, the crystalline organic thin film layers that comprise the multilayer crystalline organic thin film structures disclosed herein are preferably single crystal organic materials.

Figure 8:
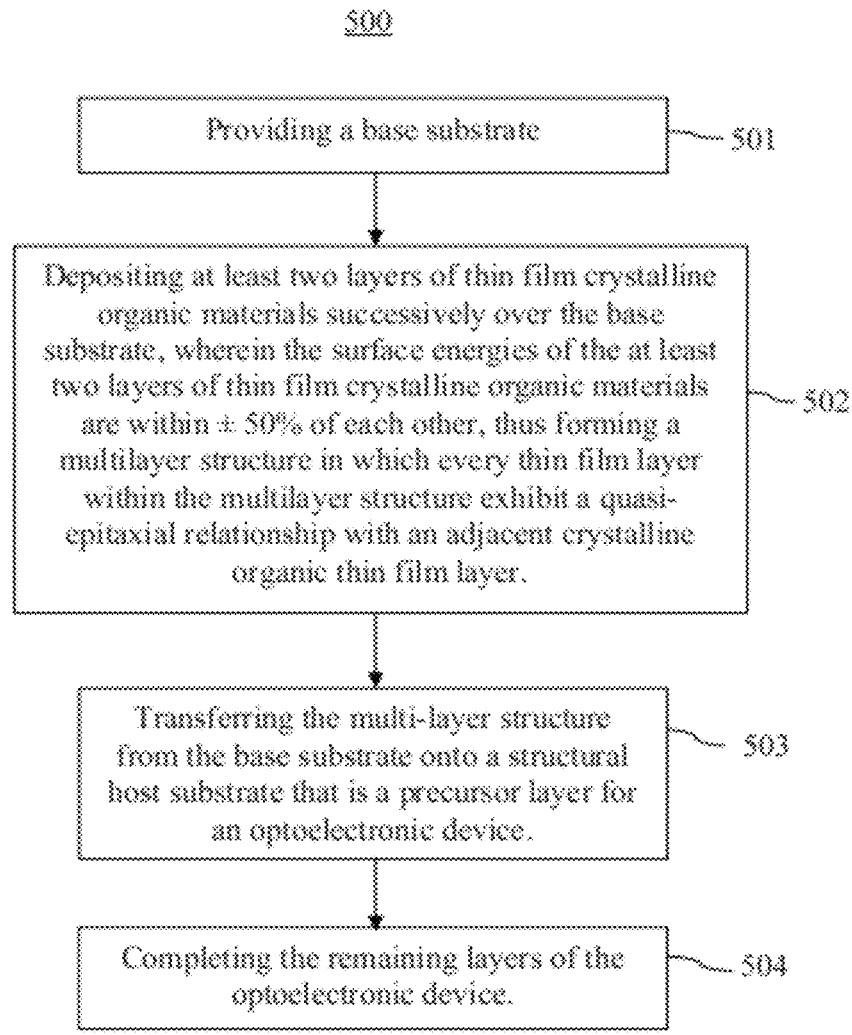
FIG. 8 is a flowchart illustrating a method of fabricating the optoelectronic devices incorporating the ordered multilayer crystalline organic thin film structure according to another aspect of the present disclosure.

Referring to the flowchart 500 shown in FIG. 8, such method can comprise providing a base substrate, such as a KBr substrate, (see block 501) and depositing at least two thin film layers comprising at least two crystalline organic materials I, II over the base substrate by a deposition method such as OVPD (see block 502) thus forming the ordered multilayer crystalline organic thin film structure 100, wherein the surface energies of the at least two layers of thin film crystalline layers are within ±50% of each other. This results in a structure where every thin film layer within the multilayer crystalline organic thin film structure exhibit a quasi-epitaxial relationship with an adjacent crystalline organic thin film layer. Next, the multilayer crystalline organic thin film structure 100 is transferred from the base substrate onto another substrate, a structural host substrate, that is a precursor for forming an optoelectronic device (see block 503), and forming the remaining layers for the optoelectronic device.

Figure 9A:
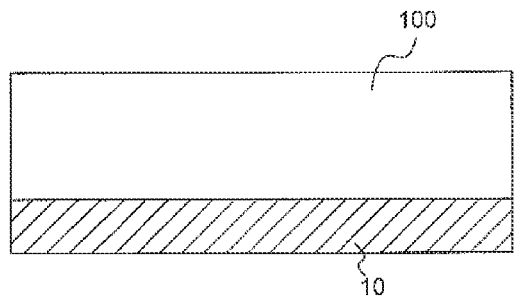
FIGS. 9(a)-9(f) show an example of how a multilayer crystalline organic thin film structure of the present disclosure may be incorporated into an optoelectronic device.
Figure 9B:
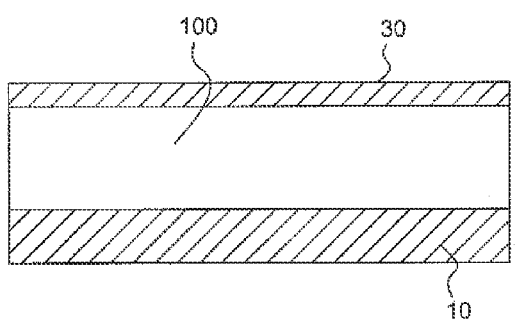
Figure 9C:
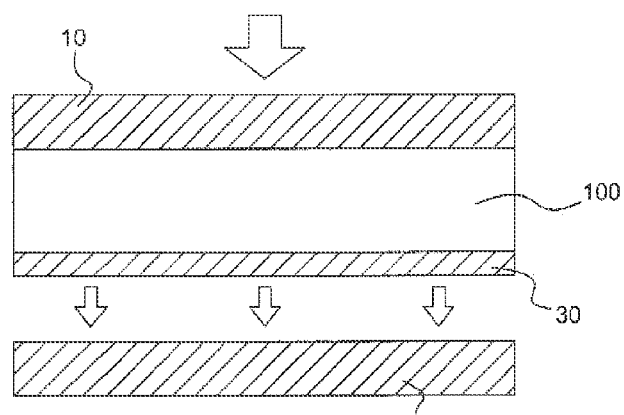
Figure 9D:
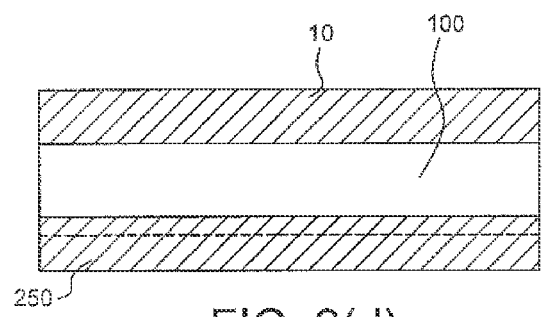
Figure 9E:
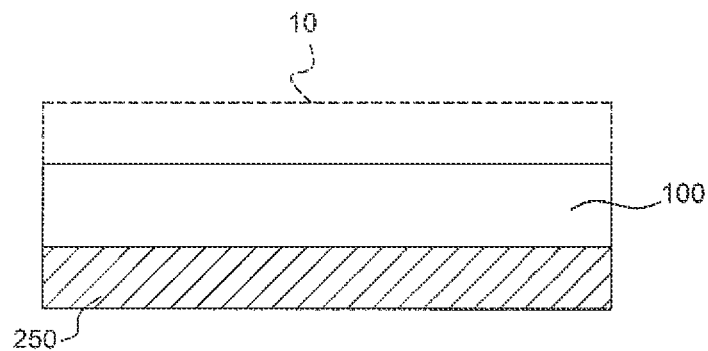
Figure 9F:
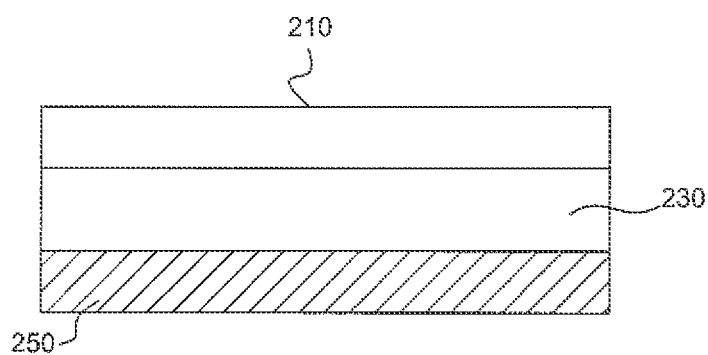

The transfer of the ordered multilayer crystalline organic thin film structure 100 from the base substrate can be accomplished by a stamping or a wet transfer process. Referring to FIGS. 9(a)-9(f), an example of a wet transfer process for transferring the multilayer crystalline organic thin film structure 100 from the base substrate would generally involve the following steps. FIG. 9(a) shows the multilayer crystalline organic thin film structure 100 grown on the base substrate 10. A thin layer of Ag 30 is deposited on top of the multilayer crystalline organic thin film structure 100 as a transfer promoting layer. (See FIG. 9(b)). The multilayer crystalline organic thin film structure 100 is then pressed onto a base substrate 250, in this case a Ag substrate. (See FIG. 9(c)). Compressing the transfer layer 30 to the base substrate 250 cold-welds and fuses the transfer layer 30 to the base substrate 250. (See FIG. 9(d)). Next, the base substrate 10 can be removed by a wet process by immersing the structure in water which dissolves the base substrate 10 and leave behind the quasi-epitaxially grown multilayer crystalline organic thin film structure 100 transferred to the Ag substrate 250. (See FIG. 9(e)). Next, an anode layer 210 (e.g. ITO) is deposited on the multilayer crystalline organic thin film structure 100, resulting in an OPV cell where the multilayer crystalline organic thin film structure 100 forms the photoactive region 230 of the OPV between the anode 210 and cathode 250. (See FIG. 9(f)).

As discussed above, where the optoelectronic device is a photosensitive device such as an organic photovoltaic (OPV) cell, the two single crystal organic materials are donor and acceptor materials and the multilayer crystalline organic thin film structure forms a photoactive region of the organic photosensitive device. Where the optoelectronic device is an OLED, one of the two single crystal organic materials is a host material and the other of the two single crystal organic materials is a dopant material and the multilayer crystalline organic thin film structure forms the light emitting region of the OLED.

The foregoing description and examples have been set forth merely to illustrate the invention and are not intended to be limiting. Each of the disclosed aspects and embodiments of the present disclosure may be considered individually or in combination with other aspects, embodiments, and variations of the invention. In addition, unless otherwise specified, none of the steps of the methods of the present disclosure are confined to any particular order of performance. Modifications of the disclosed embodiments incorporating the spirit and substance of the invention may occur to persons skilled in the art and such modifications are within the scope of the present invention.

What is claimed is:

1. A method for forming an ordered multilayer crystalline organic thin film structure, the method comprising:
   depositing at least two layers of thin film crystalline organic materials successively, forming the multilayer crystalline organic thin film structure,
   wherein surface energies of the at least two layers of thin film crystalline layers are within ±50% of each other,
   whereby all of the at least two layers of thin film crystalline organic materials within the multilayer crystalline organic thin film structure exhibit a quasi-epitaxial relationship with the adjacent crystalline organic thin film.

2. The method of claim 1, wherein the at least two layers of thin film crystalline organic materials are single crystal organic materials.

3. The method of claim 1, wherein the surface energies of each of the at least two layers of thin film crystalline organic materials are within ±15% of each other.

4. The method of claim 1, wherein the at least two layers of thin film crystalline organic materials comprise at least two crystalline organic materials.

5. The method of claim 4, wherein the at least two crystalline organic materials comprise donor and acceptor materials and the multilayer crystalline organic thin film structure forms a photoactive structure.

6. The method of claim 5, wherein the at least two crystalline organic materials comprise a donor/acceptor material pair of NTCDA and DB-TCNQ, tetracene and pentacene, pentacene and $C_{60}$, or tetracene and $C_{60}$.

7. The method of claim 4, wherein the at least two crystalline organic materials are a transport/barrier material and an emissive material and the multilayer crystalline organic thin film structure forms a light emitting structure.

8. The method of claim 7, wherein the at least two crystalline organic materials comprise a transport/barrier and emissive material pair of anthracene and tetracene, tetracene and rubrene, or anthracene and rubrene.

9. The method of claim 1, wherein one of the at least two layers of thin film crystalline organic materials is a base substrate that weakly interacts with the other of the at least two layers of thin film crystalline organic materials.

10. The method of claim 1, wherein one of the at least two layers of thin film crystalline organic materials is a base substrate that structurally templates the other of the at least two layers of thin film crystalline organic materials.

11. The method of claim 1 further comprising a step of providing a base substrate, wherein the at least two layers of thin film crystalline organic materials are deposited on the base substrate forming the multilayer crystalline organic thin film structure, and
wherein the base substrate comprises a material that weakly interacts with the thin film crystalline organic layer deposited thereon.

12. The method of claim 1 further comprising providing a base substrate, wherein the at least two layers of thin film crystalline organic materials are deposited on the base substrate forming the multilayer crystalline organic thin film structure, and
wherein the base substrate comprises a material that structurally templates the thin film crystalline organic layer deposited thereon.

13. An organic photosensitive device, comprising:
a first electrode;
a second electrode; and
a photoactive region disposed between the first electrode and the second electrode, the photoactive region comprising:
at least two thin film layers comprising at least two crystalline organic materials forming a multilayer crystalline organic thin film structure,
wherein one of the at least two crystalline organic materials is a hole conducting material and the other of the at least two crystalline organic materials is an electron conducting material, thereby forming a rectifying junction between the hole conducting material and the electron conducting material within the multilayer crystalline organic thin film structure, and
wherein surface energies of the at least two thin film layers are within ±50% of each other, whereby all of the crystalline organic thin film layers within the multilayer crystalline organic thin film structure exhibit a quasi-epitaxial relationship.

14. The organic photosensitive device of claim 13, wherein the at least two crystalline organic materials are single crystal organic materials.

15. The organic photosensitive device of claim 13, wherein the surface energies of the at least two thin film layers are within ±15% of each other.

16. The organic photosensitive device of claim 13, wherein the at least two crystalline organic materials comprise NTCDA and DB-TCNQ, tetracene and pentacene, pentacene and $C_{60}$ or tetracene and $C_{60}$.

17. The organic photosensitive device of claim 13, wherein the device is a photosensitive device and the hole conducting material is a donor material, the electron conducting material is an acceptor material and the two materials form a donor-acceptor heterojunction.

* * * * *